(12) United States Patent
Frey et al.

(10) Patent No.: US 7,050,348 B2
(45) Date of Patent: May 23, 2006

(54) PROCESS FOR CONTROLLING THE READ AMPLIFIERS OF A MEMORY AND CORRESPONDING MEMORY INTEGRATED CIRCUIT

(75) Inventors: Christophe Frey, Meylan (FR); Franck Genevaux, Revel (FR)

(73) Assignee: STMicroelectronics SA, Montrouge (FR)

( * ) Notice: Subject to any disclaimer, the term of this patent is extended or adjusted under 35 U.S.C. 154(b) by 9 days.

(21) Appl. No.: 10/880,343

(22) Filed: Jun. 29, 2004

(65) Prior Publication Data

US 2005/0018498 A1    Jan. 27, 2005

(30) Foreign Application Priority Data

Jul. 1, 2003    (FR) .................................. 03 07983

(51) Int. Cl.
    *G11C 7/00* (2006.01)
(52) U.S. Cl. ...................... 365/210; 365/204; 365/205
(58) Field of Classification Search ................ 365/210, 365/204, 205
    See application file for complete search history.

(56) References Cited

U.S. PATENT DOCUMENTS

| 4,056,811 A | 11/1977 | Baker | 365/189 |
|---|---|---|---|
| 5,699,295 A * | 12/1997 | Yero | 365/185.21 |
| 5,742,552 A | 4/1998 | Greenberg | 365/210 |
| 6,055,187 A * | 4/2000 | Dallabora et al. | 365/185.21 |
| 6,434,068 B1 * | 8/2002 | Harada et al. | 365/201 |
| 6,512,697 B1 * | 1/2003 | Li et al. | 365/185.21 |
| 2002/0080670 A1 | 6/2002 | Kawasumi | 365/210 |
| 2002/0186579 A1 | 12/2002 | Yokozeki | 365/154 |

* cited by examiner

*Primary Examiner*—Son T. Dinh
(74) *Attorney, Agent, or Firm*—Lisa K. Jorgenson; Allen, Dyer, Doppelt, Milbrath & Gilchrist, P.A.

(57) ABSTRACT

An integrated circuit includes a memory, and the memory includes a memory plane arranged in rows and columns, and a plurality of read amplifiers connected to the columns of the memory plane. A reference path includes first and second reference columns, and a reference memory cell is connected between the first and second reference columns. A reference row is connected to the reference memory cell for selection thereof so that the first reference column conducts a discharge current and the second reference column conducts a leakage current. A control circuit is connected between the first and second reference columns and the read amplifiers. The control circuit provides an activation signal to the read amplifiers when an absolute value of a difference between voltages on the first and second reference columns exceeds a threshold.

15 Claims, 3 Drawing Sheets

PROCESS FOR CONTROLLING THE READ AMPLIFIERS OF A MEMORY AND CORRESPONDING MEMORY INTEGRATED CIRCUIT

FIELD OF THE INVENTION

The invention relates to integrated circuits, especially memory circuits, and more particularly, taking into account the leakage currents of the bit lines when controlling the read amplifiers connected to the columns of a memory.

The invention applies advantageously but not limitingly to adjusting the timing in delivering signals for monitoring a memory on the integrated circuit. In particular, the memory may be a static random access memory (SRAM) or a dynamic random access memory (DRAM). The memory may also be an embedded memory, that is, a memory embodied jointly with other components through the same technological process, and integrated within an application specific integrated circuit (ASIC).

BACKGROUND OF THE INVENTION

Conventionally, when the memory cells of a memory plane of a memory are connected in a differential mode between two bit lines one of the bit lines, during a read operation and after having been precharged to a high voltage, is discharged (drawn to ground) while the other bit line is assumed to remain at its high precharge state. However, in reality, this other bit line is also drawn to ground on account of leakage currents from the other memory cells connected to this other bit line. Additionally, the leakages are all the more significant as the number of memory points on the same column stores the information based upon inverse to the value read. This causes a reduction in the voltage difference between the two bit lines.

Customarily, the memory is equipped with a reference path (dummy path) for temporally auto-adjusting the delivery of a signal for activating the read amplifiers respectively disposed at the foot of the columns of the memory plane. These read amplifiers amplify the voltage difference present between the two bit lines during the read operation.

This reference path customarily comprises a reference column formed of two bit lines to which are connected reference memory cells. At least one of the reference memory cells is activated by a reference word line (dummy word). One of the reference bit lines, namely the one which is intended to be discharged upon the activation of the reference cell, is used to generate a signal for activating the read amplifiers.

Moreover, to compensate for the effects of the leakage currents mentioned above, and to obtain a memory operating within a high temperature span in particular, a delay circuit for delaying the delivery of the signal for activating the read amplifiers is generally inserted into the reference path to obtain a correct operation of the memory in a worst-case situation. A worst-case situation may be, for example, a very high temperature for which the leakage currents are significant. However, such an approach, if it leads to an acceptable performance in the worst-case situation, limits the performance of the memory in intermediate and normal operating situations.

SUMMARY OF THE INVENTION

An object of the invention is to take into account the leakage current of the bit line that is not supposed to have discharged when activating the read amplifiers.

This and other objects, advantages and features in accordance with the invention are provided by an integrated circuit comprising a memory device comprising a memory plane, and a reference path for temporally auto-adjusting the delivery of a signal for activating the read amplifiers disposed respectively at the feet of the columns of the memory plane.

According to a general characteristic of the invention, the reference path comprises reference memory cells respectively connected between two reference bit lines, and means for selecting at least one reference cell intended to discharge a first reference bit line. The second reference bit line conducts a leakage current. The integrated circuit may further comprise control means connected to the two bit lines delivering the activation signal when the absolute value of the difference between the values of the voltages on the two reference bit lines exceeds a predetermined threshold.

Stated otherwise, the invention uses the reference bit line which is not supposed to have discharged (but whose voltage nevertheless drops on account of the leakage currents) as a voltage generator to oversee the delivery of the read amplifiers activation signal.

The two reference bit lines to which the control means delivering the activation signal are connected may be reference bit lines to which the reference memory cells are connected directly, or else so-called global reference bit lines. The reference memory cells may then be connected to the global reference bit lines by way of intermediate reference bit lines and of transistors operating in an on or off mode (path gate).

The control means may comprise an inverter controlled by the discharge current of the first reference bit line and supplied with the leakage current of the second reference bit line. It is also preferable for the control means to furthermore comprise a flip-flop having a first input connected to the first reference bit line, a second input connected to the output of the inverter, and an output delivering the activation signal.

Another aspect of the invention is directed to a process for controlling read amplifiers disposed at the feet of the columns of a memory plane of a memory. According to a general characteristic of the invention, the memory furthermore includes a reference path comprising reference memory cells respectively connected between two reference bit lines, at least one reference cell is selected to discharge a first reference bit line, and the second reference bit line conducts a leakage current. The read amplifiers are activated when the absolute value of the difference between the values of the voltages of the two reference bit lines exceed a predetermined threshold. The activation of the read amplifiers may comprise controlling an inverter by the discharge current of the first reference bit line, and supplying the inverter with the leakage current of the second reference bit line.

BRIEF DESCRIPTION OF THE DRAWINGS

Other advantages and characteristics of the invention will become apparent on examining nonlimiting embodiments and implementations, and the appended drawings in which.

DETAILED DESCRIPTION OF THE PREFERRED EMBODIMENTS

Figure 1:
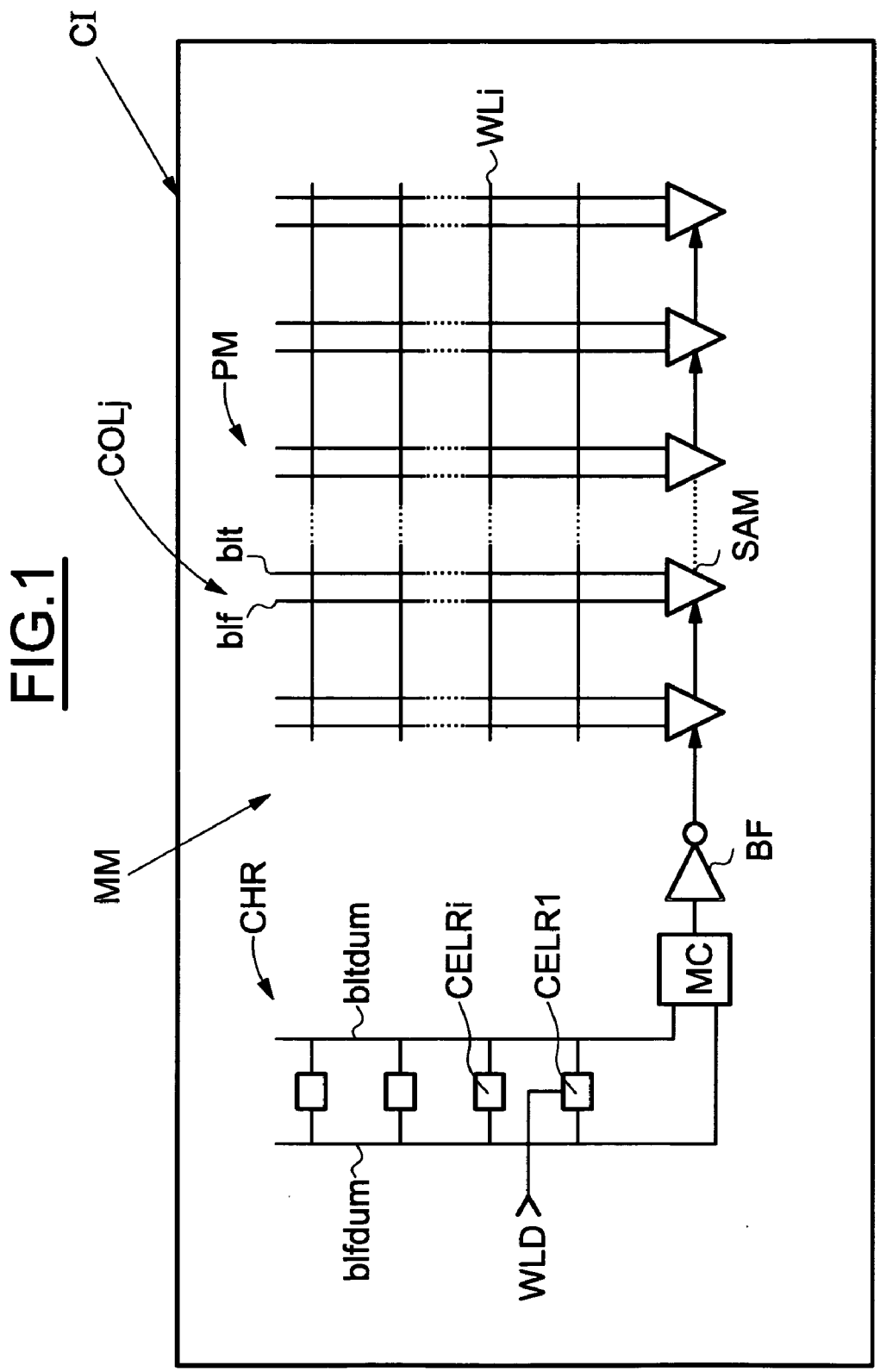
FIG. 1 diagrammatically illustrates a first embodiment of an integrated circuit according to the invention.

In FIG. 1, the reference CI designates a CMOS technology integrated circuit incorporating a memory MM comprising a memory plane PM and a reference path CHR (dummy path). The memory plane PM comprises in a conventional manner lines WLi and columns COLj. Each column COLj comprises two bit lines blt and blf. The memory cells are not represented in FIG. 1 for the sake of simplification, and are connected in a differential manner between the two bit lines blt and blf of each column and can be activated by a word line WLi.

Moreover, read amplifiers SAM are disposed at the foot of the columns of the memory plane and are activated by an activation signal delivered, before entering an amplifier (buffer) BF, by control means MC. A conventional column decoder is disposed after the amplifiers SAM, and is not represented here for the sake of simplification.

The reference path CHR comprises a reference column formed of two reference bit lines bltdum and blfdum. Reference memory cells CELRi are connected to the reference column. At least one of the reference memory cells CELRi is activated by a reference word line WLD (dummy word line). This reference memory cell is referenced CELR1. The memory cell activated by the reference word line WLD is programmed in such a way as to draw to ground, that is, to discharge the reference bit line bltdum.

The other reference cells CELRi are programmed with opposite data from that stored in the cell CELR1. Therefore, as will be shown in greater detail in FIG. 2, the reference bit line blfdum, which is not supposed to discharge, is in fact also drawn to ground by the sum of the leakage currents of the access transistors of the cells CELRi in their off state.

By using a reference column having n−1 reference cells (n designating the number of memory cells of a column of the memory plane PM) programmed with an opposite data item from that contained in the cell or cells CELRi, it is possible to make allowance for a worst operating case in which the leakage current of a column is at a maximum. Moreover, although a single cell CELRi has been represented in FIG. 1, in practice, several reference cells of the type CELRi may be activated by the word line WLD to produce a faster discharge of the bit line bltdum than the discharge of a bit line bit of a column of the memory plane.

In contradiction to the reference path of the prior art, the reference bit line blfdum, which is not supposed to discharge, but which in fact discharges slowly on account of the leakage currents, is used for the control of the signal for activating the amplifiers SAM. It is on account of this that the control means MC are connected both to the bit line bltdum which is supposed to discharge when the cell CLRi is activated, and to the bit line blfdum which is not supposed to discharge.

Figure 2:
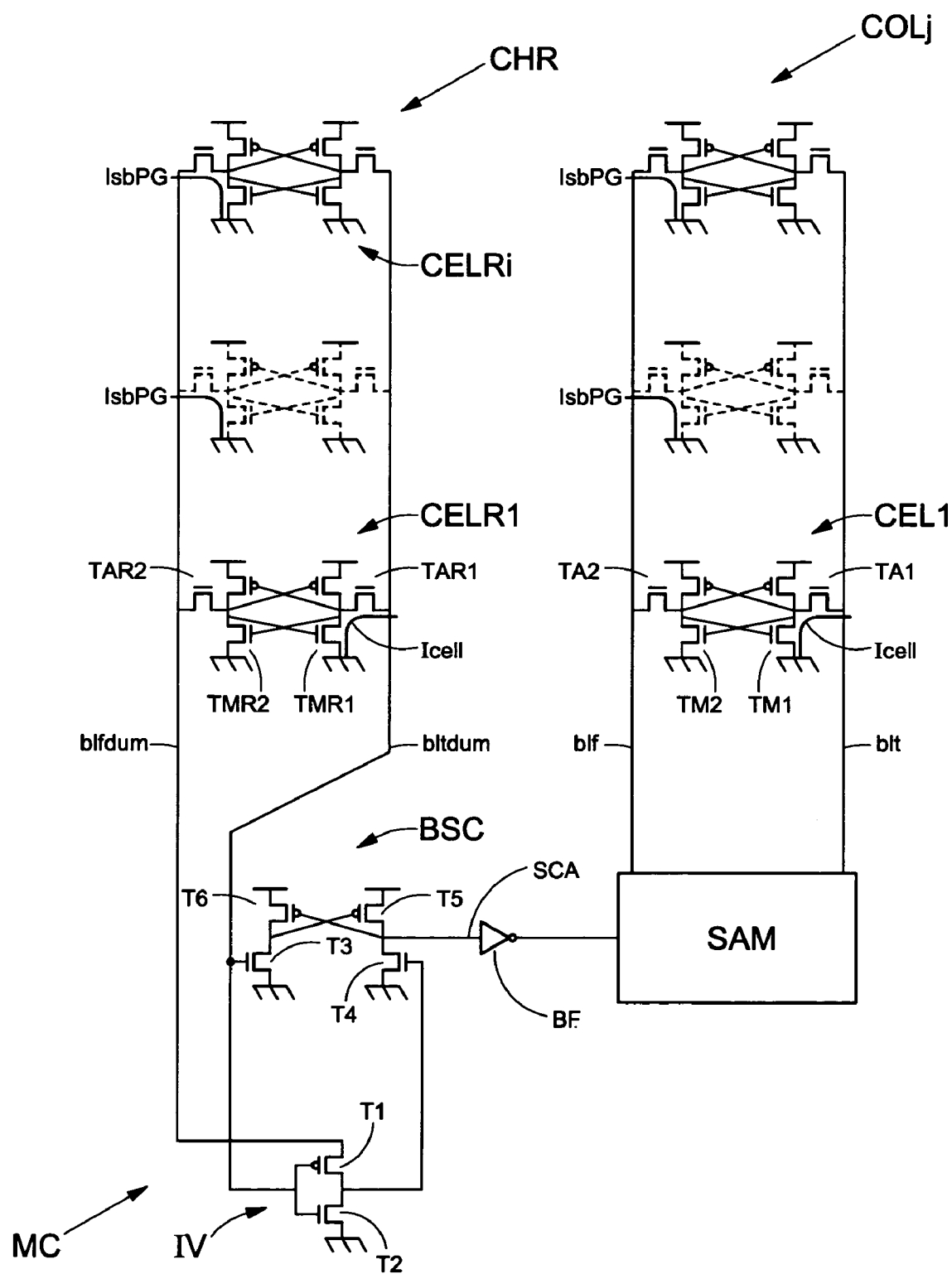
FIG. 2 illustrates in greater detail a portion of the integrated circuit of FIG. 1.

A single column COLj of the memory plane MP has been represented in FIG. 2 for the sake of simplification. In this example, the memory cells of the memory plane as well as the reference cells are cells of the SRAM type, with four storage transistors and two access transistors.

The control means MC comprise a CMOS inverter referenced IV, and comprises a PMOS transistor T1 connected in series with an NMOS transistor T2. The gates of the two transistors T1 and T2 are connected together on the reference bit line bltdum. The source of the transistor T2 is grounded while the source of the transistor T1 is linked to the bit line blfdum. The drains of the two transistors T1 and T2 are linked to the gate of a transistor T4 belonging to a flip-flop BSC.

The flip-flop BSC comprises another transistor T3 whose gate is linked to the bit line bltdum. In addition to these two NMOS transistors T3 and T4, the flip-flop BSC comprises in a conventional manner two other PMOS transistors T5 and T6 whose gates are connected in a cross fashion to the drains of the transistors T3 and T4. The drain of the transistor T4 forms the output of the flip-flop BSC and provides the activation signal SCA which, after entering the buffer BF, activates the read amplifier SAM.

In the example illustrated in FIG. 2, it is assumed that the lowest cell of column j is intended to be read and that it is programmed such that when the access transistors of this cell are activated, the right-hand access transistor in FIG. 2 (TA1) is on, drawing the bit line blt to ground (current ICell). Stated otherwise, the cell CEL1 is programmed to have a 1 on the gate of the transistor TM1, and a 0 on the gate of the transistor TM2.

Moreover, it is assumed that the other cells of this column COLj are programmed with an opposite value to that of the lowest cell. This leads to the left-hand access transistors of these cells being turned off. The reference IsbPG then designates the leakage current of these transistors. These transistors have a maximum leakage current since they have a voltage difference equal to Vdd between their drain and their source. Together, these leakage currents will therefore lead to the bit line blf also being drawn to ground.

As far as the reference path CHR is concerned, the cell CELR1 is programmed in this example in the same manner as the cell CEL1, that is, with a 1 on the gate of the storage transistor TMR1 and a 0 on the gate of the transistor TMR2. Thus, upon the activation of this cell CELR1 by the word line WLD, the transistor TAR1 and the transistor TMR1 are on, thereby leading to the discharging of the reference bit line bltdum.

Although only one cell CELR1 has been represented in FIG. 2 for the sake of simplification, the word line WLD in fact activates several cells CELR1 programmed in an identical way. This is done to obtain a faster discharge of the line bltdum than the discharge of the line blt.

The other cells CELRi of the reference column are programmed in the opposite way, so that the left-hand access transistors of these cells are in their off state, thereby causing the discharge of the line blfdum by the leakage currents IsbPG of these transistors. Just after the precharging of the bit lines bltdum and blfdum, there is a logic 1 on the gate of the transistor T3 and a logic 0 on the gate of the transistor T4 of the flip-flop BSC. The signal SCA is at a 1, thus rendering the read amplifier SAM inactive.

In tandem with the discharging of the bit lines bltdum and blfdum, the current in the transistor T1 of the inverter will increase, more or less slowly as a function of the value of the voltages on the bit lines bltdum and blfdum. When the current passing through the transistor T1 becomes greater than the current passing through the transistor T2, the inverter IV sees its output go to 1, thereby causing a drop to 0 of the signal SCA, and consequently the activation of the read amplifier SAM.

The more leakages there are on the line blfdum, the faster the voltage of this line blfdum will drop, the output voltage of the inverter IV will rise slower and the output voltage will take more time to exceed the voltage present on the line bltdum, that is to say to make the signal SCA go to 0. Conversely, the fewer leakages there are on the bit line blfdum, the slower the voltage on this line blfdum will fall and the faster the output voltage of the inverter IV will rise. This will quickly cause the toggling to 0 of the signal SCA.

Figure 3:
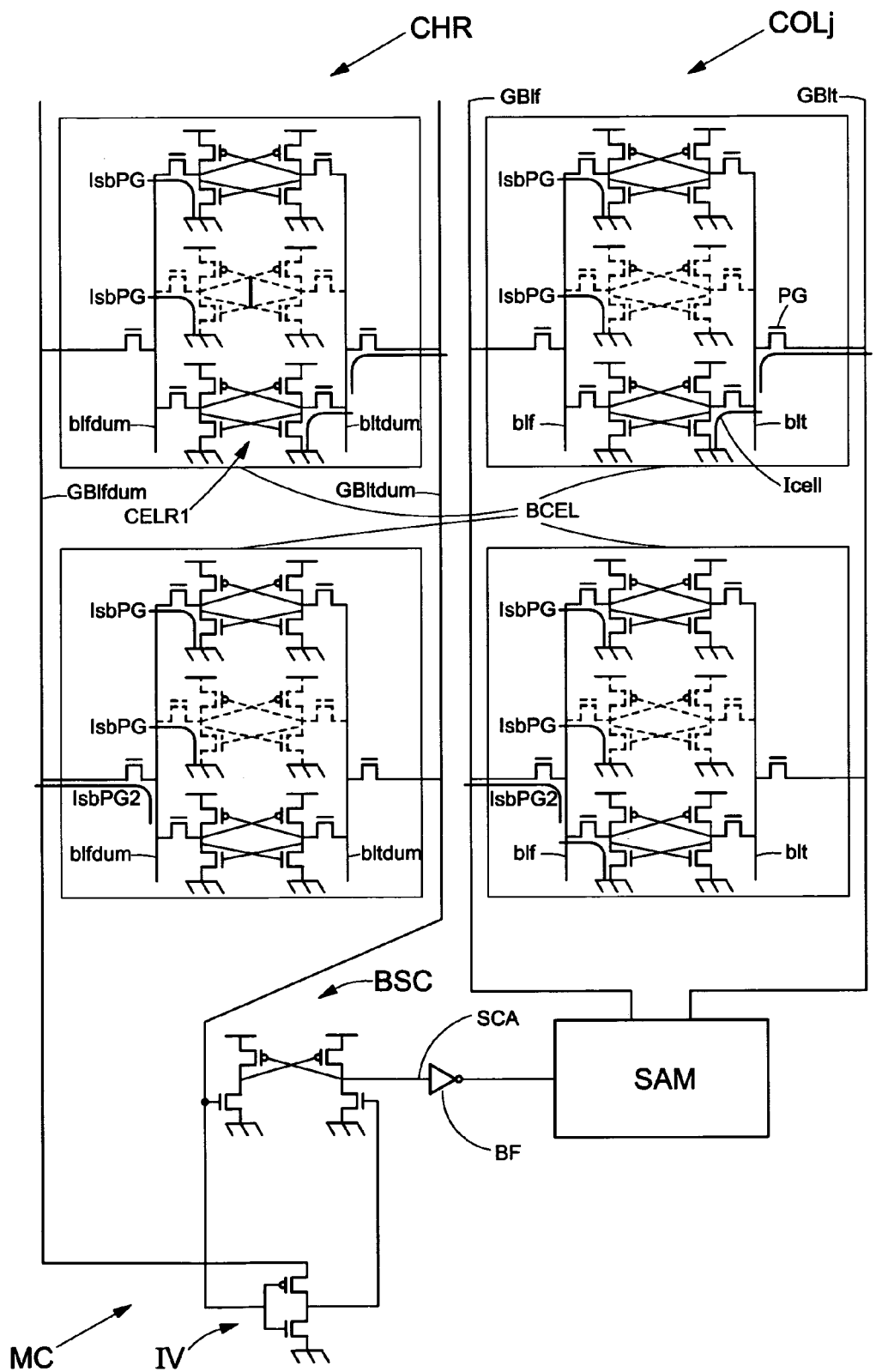
FIG. 3 diagrammatically illustrates a second embodiment of an integrated circuit according to the invention.

The device according to the invention thus makes it possible to take into account the effect of the temperature on the leakage currents. The invention is not limited to the embodiment just described but applies also, as illustrated in FIG. 3, when the memory plane and the-column of the reference path CHR are made up of several blocks BCEL. Each block comprises several memory cells. The memory cells of each of the blocks are connected directly to bit lines and to reference bit lines.

Moreover, as far as the memory plane is concerned, the lines blt and blf of each block are linked respectively to a global bit line GBlt and another global bit line GBlf by way of transistors PG (path gate) operating in off or on mode. Also, global bit lines are linked to the read amplifier SAM. Likewise, as far as the reference path is concerned, the bit lines blfdum and bltdum of each block BCEL of reference memory cells are connected by transistors of the path gate type to global reference lines GBlfdum and GBltdum.

Also, it is these global lines that are linked to the control means MC in the manner described above. Thus, this embodiment makes it possible to take account not only of the leakage of the off access transistors of the reference cells, but also the leakage IsbPG2 of the off transistors linking the bit lines blfdum to the global bit line GBlfdum.

The invention claimed is:

1. An integrated circuit comprising:
   a memory comprising
     a memory plane arranged in rows and columns,
     a plurality of read amplifiers connected to the columns of said memory plane,
     a reference path comprising first and second reference columns, and at least one reference memory cell connected between said first and second reference columns,
     a reference row connected to said at least one reference memory cell for selection thereof so that said first reference column conducts a discharge current and said second reference column conducts a leakage current, and
     a control circuit connected between said first and second reference columns and said plurality of read amplifiers, said control circuit providing an activation signal to said plurality of read amplifiers when an absolute value of a difference between voltages on said first and second reference columns exceeds a threshold.

2. An integrated circuit according to claim 1, wherein said control circuit comprise an inverter controlled by the discharge and leakage currents from said first and second reference columns.

3. An integrated circuit according to claim 2, wherein said control circuit further comprises a flip-flop having a first input connected to said first reference column, a second input connected to an output of said inverter, and an output for providing the activation signal.

4. An integrated circuit according to claim 1, wherein said at least one reference memory cell is directly connected between said first and second reference columns.

5. An integrated circuit according to claim 4, further comprising:
   first and second reference path transistors respectively connected to said first and second reference columns; and
   first and second global reference columns respectively connected to said first and second reference path transistors.

6. A memory comprising:
   a memory plane arranged in rows and columns;
   a plurality of read amplifiers connected to the columns of said memory plane;
   a reference path comprising first and second reference columns, and at least one reference memory cell connected between said first and second reference columns;
   a reference row connected to said at least one reference memory cell for selection thereof so that said first reference column conducts a discharge current and said second reference column conducts a leakage current; and
   a control circuit connected between said first and second reference columns and said plurality of read amplifiers, said control circuit providing an activation signal to said plurality of read amplifiers based upon a difference between voltages on said first and second reference columns exceeding a threshold.

7. A memory according to claim 6, wherein said control circuit comprise an inverter controlled by the discharge and leakage currents from said first and second reference columns.

8. A memory according to claim 7, wherein said control circuit further comprises a flip-flop having a first input connected to said first reference column, a second input connected to an output of said inverter, and an output for providing the activation signal.

9. A memory according to claim 6, wherein said at least one reference memory cell is directly connected between said first and second reference columns.

10. A memory according to claim 9, further comprising:
    first and second reference path transistors respectively connected to said first and second reference columns; and first and second global reference columns respectively connected to said first and second reference path transistors.

11. A process for controlling a memory comprising a memory plane arranged in rows and columns, a plurality of read amplifiers connected to the columns of the memory plane, a reference path comprising first and second reference columns and at least one reference memory cell connected between the first and second reference columns, and a control circuit connected between the first and second reference columns and the plurality of read amplifiers, the process comprising:

selecting the at least one reference memory cell so that the first reference column conducts a discharge current and the second reference column conducts a leakage current; and providing an activation signal from the control circuit to the plurality of read amplifiers when a difference between voltages on the first and second reference columns exceeds a threshold.

12. A process according to claim 11, wherein the control circuit comprise an inverter controlled by the discharge and leakage currents from the first and second reference columns.

13. A process according to claim 12, wherein the control circuit further comprises a flip-flop having a first input connected to the first reference column, a second input connected to an output of the inverter, and an output providing the activation signal.

14. A process according to claim 11, wherein the at least one reference memory cell is directly connected between the first and second reference columns.

15. A process according to claim 14, wherein the memory further comprises first and second reference path transistors respectively connected to the first and second reference columns; and first and second global reference columns respectively connected to the first and second reference path transistors.

* * * * *